United States Patent
Schaefer et al.

(10) Patent No.: US 11,143,679 B2
(45) Date of Patent: Oct. 12, 2021

(54) METHOD AND APPARATUS FOR PROCESSING A MEASUREMENT SIGNAL

(71) Applicant: Rohde & Schwarz GmbH & Co. KG, Munich (DE)

(72) Inventors: Andrew Schaefer, Oberhaching (DE); Markus Freidhof, Kirchseeon (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 361 days.

(21) Appl. No.: 16/371,245

(22) Filed: Apr. 1, 2019

(65) Prior Publication Data

US 2020/0309826 A1    Oct. 1, 2020

(51) Int. Cl.
*G01R 19/25*    (2006.01)
*G01R 19/257*    (2006.01)

(52) U.S. Cl.
CPC ....... *G01R 19/2509* (2013.01); *G01R 19/257* (2013.01)

(58) Field of Classification Search
None
See application file for complete search history.

(56) References Cited

U.S. PATENT DOCUMENTS

| 8,674,713 | B2 | 3/2014 | Miyazaki | |
| 9,331,842 | B2 * | 5/2016 | Flake | H04B 3/02 |
| 9,344,203 | B2 * | 5/2016 | Ran | H04L 1/205 |
| 2004/0201373 | A1 | 10/2004 | Kato | |
| 2010/0057388 | A1 * | 3/2010 | LeBrun | H04L 12/403 702/67 |
| 2012/0098556 | A1 | 4/2012 | Miyazaki | |
| 2013/0207641 | A1 * | 8/2013 | Timm | G01R 13/0272 324/121 R |
| 2016/0231357 | A1 * | 8/2016 | Taratorin | G01R 13/029 |
| 2016/0341766 | A1 * | 11/2016 | Deverson | G01R 13/029 |
| 2017/0016953 | A1 * | 1/2017 | Beer | G01R 27/28 |
| 2018/0113160 | A1 * | 4/2018 | Warburton | G06F 17/17 |
| 2020/0106265 | A1 * | 4/2020 | Bhat | G01R 1/36 |
| 2020/0309826 | A1 * | 10/2020 | Schaefer | G01R 19/2509 |
| 2020/0333378 | A1 * | 10/2020 | Yang | G01R 13/0218 |
| 2020/0334189 | A1 * | 10/2020 | Yang | G06F 13/42 |

FOREIGN PATENT DOCUMENTS

EP    2444816 A2    4/2012

* cited by examiner

*Primary Examiner* — Lincoln D Donovan
*Assistant Examiner* — Khareem E Almo
(74) *Attorney, Agent, or Firm* — Westman, Champlin & Koehler, P.A.

(57) ABSTRACT

A method for and apparatus processing a measurement signal of a dynamic physical quantity is provided which includes acquiring a measurement signal representing the dynamic physical quantity over time; comparing the acquired measurement signal with a predefined signal characteristic of the respective physical quantity or with a signal characteristic of another physical quantity being dependent from the respective physical quantity to provide a comparison result; and adjusting a waveform representing the acquired measurement signal based upon the comparison result. A digital oscilloscope is also provided.

12 Claims, 4 Drawing Sheets

METHOD AND APPARATUS FOR PROCESSING A MEASUREMENT SIGNAL

FIELD OF THE INVENTION

The invention relates to a method and apparatus for processing a measurement signal of a dynamic signal quantity.

TECHNICAL BACKGROUND

A measurement apparatus such as a digital oscilloscope can receive a measurement signal from a probe connecting the measurement apparatus to a device under test DUT forming a measurement object. The process provided to provide a signal from the device under test DUT to the measurement apparatus is as transparent as possible. A probe forms more than a simple accessory since it forms the point of contact between the measurement apparatus or measurement instrument and the device under test being measured. Accordingly, the electrical characteristics of the probe and the way it is connected to the measurement apparatus as well as its interaction with both the measurement apparatus and the device under test DUT has a significant impact on the measurement. However, some measurement probes comprise limitations. For example, some current probes such as the Rogowski current probes are not able to detect DC signals. Accordingly, when using such a current probe, the DC portion of a measured signal of the device under test DUT cannot be detected and processed by the measurement apparatus. In such a scenario, a user of the measurement apparatus does only see some kind of relative current without any indication about an existing DC portion of the respective measured signal.

Accordingly, there is a need to provide a method and apparatus for processing a measurement signal of a measured dynamic physical quantity to overcome such limitations of a measurement setup, in particular limitations caused by the used measurement probe.

SUMMARY OF THE INVENTION

The invention provides according to a first aspect a method for processing a measurement signal of a dynamic physical quantity comprising the steps of:
acquiring a measurement signal representing the dynamic physical quantity over time,
comparing the acquired measurement signal with a predefined signal characteristic of the respective physical quantity or with a signal characteristic of another physical quantity being dependent from the respective physical quantity to provide a comparison result and
adjusting a waveform representing the acquired measurement signal based upon the comparison result.

In a possible embodiment of the method according to the first aspect of the present invention, the acquired measurement signal is stored in a first memory of a measurement apparatus.

In a further possible embodiment of the method according to the first aspect of the present invention, the signal characteristic of the physical quantity is read from a second memory of a measurement apparatus.

In a further possible embodiment of the method according to the first aspect of the present invention, the predefined signal characteristic of the physical quantity comprises a value or a value range of the physical quantity at a specific time or during a specific time period.

In a further possible embodiment of the method according to the first aspect of the present invention, the predefined signal characteristic of the physical quantity comprises a slew rate of the physical quantity.

In a still further possible embodiment of the method according to the first aspect of the present invention, the predefined signal characteristic of the physical quantity comprises a specific signal form or a specific signal pattern of the respective physical quantity.

In a further possible embodiment of the method according to the first aspect of the present invention, the adjusted waveform of the measurement signal is displayed as a signal trace along a time axis on a screen of a display unit of a measurement apparatus.

In a still further possible embodiment of the method according to the first aspect of the present invention, the waveform representing the measurement signal is adjusted by shifting the associated signal trace on the screen of the display unit perpendicular to the time axis.

In a further possible embodiment of the method according to the first aspect of the present invention, an analog measurement signal of the dynamic physical quantity is provided by a probe attached to a measurement object.

In a further possible embodiment of the method according to the first aspect of the present invention, the analog measurement signal provided by the probe is converted by an analog to digital converter into a digital measurement signal acquired and stored in the first memory of the measurement apparatus.

In a still further possible embodiment of the method according to the first aspect of the present invention, the at least one predefined signal characteristic stored in the second memory is loaded from a signal characteristic repository stored in a database comprising a plurality of specific signal characteristics for a plurality of selectable measurement objects.

In a further possible embodiment of the method according to the first aspect of the present invention, the measurement object comprises an electronic circuit of a device under test.

In a further possible embodiment of the method according to the first aspect of the present invention, the predefined signal characteristic is derived from a circuit design or from a specification of the device under test or is derived from a test protocol applied to the device under test.

The invention further provides according to a further aspect a measurement apparatus comprising a processor adapted to compare an acquired measurement signal representing a dynamic physical quantity over time stored in a first memory of said measurement apparatus with a predefined signal characteristic of the respective physical quantity or with a predefined signal characteristic of another physical quantity being dependent from the respective physical quantity stored in a second memory of said measurement apparatus to calculate comparison results and further adapted to adjust a waveform representing the acquired measurement signal based upon the calculated comparison result.

In a possible embodiment of the measurement apparatus according to the second aspect of the present invention, the measurement apparatus further comprises a configuration interface used to configure the predefined signal characteristic of the physical quantity in response to a user input and/or used to load a selected predefined signal characteristic of the physical quantity from a signal characteristic repository stored in a database.

In a further possible embodiment of the measurement apparatus according to the second aspect of the present invention, the measurement apparatus further comprises a signal input adapted to receive an analog measurement signal of the dynamic physical quantity provided by a probe attached to a measurement object and comprising an analog to digital converter adapted to convert the received analog measurement signal into a digital measurement signal acquired and stored in the first memory of the measurement apparatus.

The invention further provides according to a further aspect a digital oscilloscope comprising
a signal input adapted to receive an analog measurement signal provided by a probe attached to a measurement object,
an analog to digital converter adapted to convert the received analog signal into a digital measurement signal,
a first memory adapted to acquire and store the converted digital measurement signal,
a second memory which stores at least one predefined signal characteristic of a physical quantity or at least one physical characteristic of another physical quantity being dependent from the respective physical quantity and
a processor adapted to compare the acquired digital measurement signal stored in the first memory with the predefined signal characteristic stored in the second memory to calculate a comparison result and to adjust a waveform representing the acquired digital measurement signal stored in the first memory based upon the calculated comparison result,
wherein the adjusted waveform of the measurement signal is displayed as a signal trace along a time axis on a screen of a display unit of said digital oscilloscope.

DETAILED DESCRIPTION OF EMBODIMENTS

In the following, possible embodiments of the different aspects of the present invention are described in more detail with reference to the enclosed figures.

Figure 1:
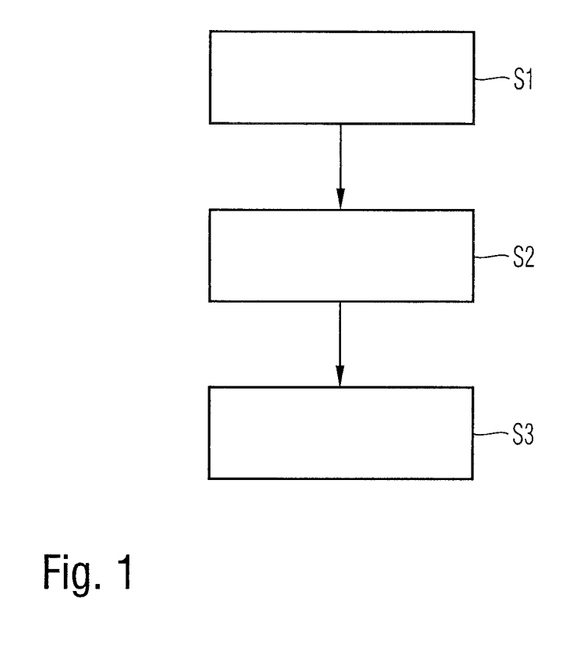
FIG. 1 shows a flowchart of a possible exemplary embodiment of a method for processing a measurement signal of a dynamic physical quantity according to a first aspect of the present invention.

As can be seen from the schematic flowchart illustrated in FIG. 1, a method for processing a measurement signal of a dynamic physical quantity according to the first aspect of the present invention can comprise three main steps as shown in FIG. 1. The dynamic physical quantity can comprise any dynamic or time-dependent physical quantity of a measurement object, in particular an electrical quantity such as an electrical current, a voltage or other electrical parameters of a measurement object. The physical quantity can also comprise any physical stimulus such as sound, mechanical stress, pressure, light or heat which can be transformed by means of a sensor element into an electrical signal. For example, a microphone forms a sensor that can convert acoustic sound into an electrical signal.

In a first main step S1, a measurement signal representing the dynamic physical quantity over time is acquired.

In a further step S2, the acquired measurement signal is compared with a predefined signal characteristic of the respective physical quantity to provide a comparison result. It is also possible to compare the acquired measurement signal with a signal characteristic of another physical quantity comprising a dependency with the respective physical quantity. This dependency can be either by physical laws expressed by equations used to process data or derived from a functional relationship stored in a memory.

In a further step S3, the waveform representing the acquired measurement signal is adjusted automatically based on the comparison result.

In a possible embodiment, the measurement signal acquired in step S1 can be stored in a first memory of a measurement apparatus such as a digital oscilloscope. Further, the signal characteristic used in step S2 can be read in a possible embodiment from a second memory of the measurement apparatus.

The predefined signal characteristic compared with the acquired measurement signal in step S2 can comprise in a possible embodiment a value or a value range of the physical quantity at a specific time or during a specific time period. In a further possible embodiment, the predefined signal characteristic can also comprise a slew rate of the respective physical quantity. In a still further possible embodiment, the predefined signal characteristic of the physical quantity can also comprise a specific signal form or a specific signal pattern of the respective physical quantity.

In a possible embodiment, the predefined signal characteristic of the physical quantity stored in the second memory can be configured by means of a configuration interface. In an alternative embodiment, at least one predefined signal characteristic stored in the second memory is loaded from a signal characteristic repository stored in a database comprising a plurality of specific signal characteristics for a plurality of different selectable measurement objects. These measurement objects can comprise electronic circuits or a subcomponents of a device under test DUT. In a possible embodiment, the predefined signal characteristic can be derived automatically from a circuit design or from a specification of the device under test DUT. In a still further possible embodiment, the predefined signal characteristic is derived automatically from a test protocol applied to the respective device under test DUT.

A measurement signal representing the dynamic physical quantity over time acquired in step S1 can comprise an analog measurement signal of the dynamic physical quantity provided by a probe attached to the measurement object or device under test DUT. The analog measurement signal provided by the probe can be converted by an analog to digital converter into a digital measurement signal acquired in step S1 and stored in a first memory of a measurement apparatus such as a digital oscilloscope. The predefined signal characteristic is compared with the acquired measurement signal and can be stored in another memory of the measurement apparatus. It can be configured in a possible embodiment by means of a configuration interface of said measurement apparatus. The measurement apparatus such as a digital oscilloscope can comprise a configuration interface connected via a network to a remote database. In this embodiment, at least one predefined signal characteristic can be loaded from a signal characteristic repository of the database and stored in the second memory of the measurement apparatus for comparing the loaded signal characteristic with the acquired measurement signal in step S2.

A waveform representing the acquired measurement signal is adjusted automatically based on the comparison result calculated in step S2. The waveform adjusted in step S3 can be displayed as a signal trace along a time axis on a screen of a display unit of the measurement apparatus. The waveform representing the measurement signal can be adjusted by shifting the associated signal trace on the screen of the display unit perpendicular to the time axis.

Figure 5:
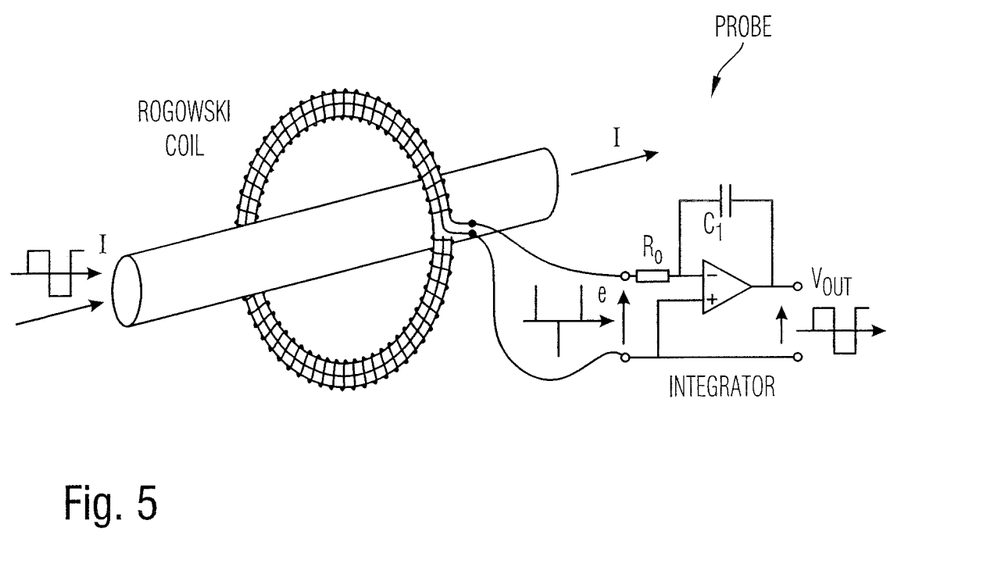
FIG. 5 shows schematically an exemplary probe providing a measurement signal which can be processed by the method and apparatus according to the present invention.

In the method according to the present invention as illustrated in the schematic flowchart of FIG. 1, system knowledge is exploited to generate a more useful and meaningful output of the recorded measurement signal. The predefined signal characteristic reflects the system knowledge. The system knowledge comprises technical information about the measurement object or device under test DUT. For example, if the device under test DUT comprises an electronic circuit with a power MOSFET, it may be known that e.g. 5 microseconds after a particular rising signal edge the gate current at the gate of the MOSFET is always 0 Ampere. This technical knowledge can be exploited to compensate for limitations of the used probe. A corresponding predefined signal characteristic can be stored in a memory of the measurement apparatus. For example, a Rogowski current probe as also illustrated in FIG. 5 has the limitation that a DC portion of the signal cannot be detected by the probe. The technical knowledge about the system behavior of the device under test DUT can be used to compensate for the DC recording limitations of the used Rogowski current probe. For example, the predefined signal characteristic of the physical quantity such as a current measured by the current probe can comprise a specific value at a specific time of operation of the device under test DUT. The specific time can comprise a time relative to a specific event such as a rising edge of another signal. For instance, the predefined signal characteristic can comprise a value of 0 Ampere 5 microseconds after a particular rising edge. The waveform representing the acquired measurement signal is adjusted upon a comparison of at least one section of the waveform to a pre-known physical quantity or pre-known physical quantity characteristic. The pre-known physical quantity can comprise a constant current, a constant voltage or a constant power. The pre-known characteristic can also be derived from other physical quantities having a causal relationship with the respective physical quantity. The pre-known physical quantity can comprise also a slew rate of the physical quantity, in particular a current slew rate, a voltage slew rate or a power slew rate. It can also comprise any arbitrary waveform progression, in particular a specific signal pattern of the physical quantity. The adjustment of the waveform representing the acquired measurement signal performed in step S3 can be performed by shifting in a possible embodiment the associated signal trace on the screen of the display unit perpendicular to the time axis.

In a possible embodiment, a time range and/or an amplitude range can be predefined and stored as the predefined signal characteristic of the respective physical quantity in a memory of the measurement apparatus. A predefined time range and/or amplitude range can be defined as an area through which all recorded traces must pass. This can be achieved in a possible embodiment by determining a dynamic offset correction value forming a comparison result based on the recorded trace and target range. In a further step, the dynamic offset correction value can be applied to the trace for improved visualization and/or for further processing of the trace.

Figure 3:
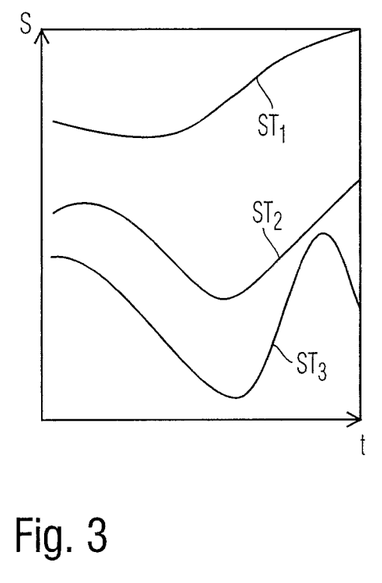
FIGS. 3, 4 illustrate a technical effect provided by a method and apparatus according to the present invention.
Figure 4:
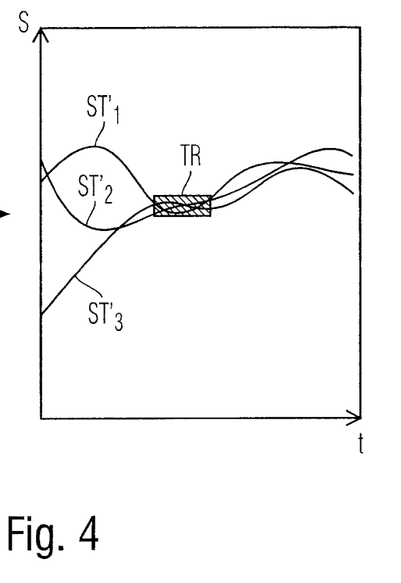

FIGS. 3, 4 illustrate schematically the application of a dynamic offset as an adjustment performed by the method according to the present invention. The provision of the comparison result by calculation in the illustrated embodiment of a dynamic correction value is not limited to a simple difference. Other, more advanced techniques can also be used such as minimizing a mean square difference to a target value over a target range as also shown in FIGS. 3, 4. FIG. 3 illustrate signal traces ST of a measurement signal displayed on a screen of a display unit of a measurement apparatus. The displayed signal traces ST represent a dynamic quantity such as an electrical current over time. In the illustrated example, the measurement signal is provided by a current probe such as a Rogowski current probe and is not capable to capture a DC portion of the signal. Accordingly, the displayed signal traces ST as illustrated in FIG. 3 provide no information about the DC portion of the measured signal. With the method according to the present invention, an offset can be calculated for every displayed signal trace ST. This can be done for instance such that all acquisitions go through a certain target level range at a certain target time range. This is essentially useful for certain isolated measurements provided by probes where a DC level is essentially unknown. The target value range and/or target time range illustrated in FIGS. 3, 4 form a target range TR which can be derived in a preferred embodiment from technical information about the measurement object to be measured. This technical system information can be derived in a possible embodiment from a circuit design or a circuit specification of the respective device under test DUT to be measured. Further, the technical information can also be derived from a test protocol applied to the respective device under test DUT. The technical information can comprise a predefined signal characteristic concerning the device under test DUT loaded from a repository stored in a remote database connected to the measurement apparatus.

As can be seen in FIG. 4, all acquisitions go through target range TR, i.e. through a certain value range at a certain time range. Accordingly, in the illustrated embodiments of FIG. 4, a single target range TR is used. In a further possible embodiment, this can be extended to include multiple target regions TR where a dynamic offset or comparison result is calculated as a best fit. Further, it is possible to use technical information of the current system state of the device under test DUT. In the illustrated embodiments of FIGS. 3, 4, the used target region TR has a rectangular shape. However, the target region TR is not restricted to a rectangular shape or a specific time. In a possible embodiment, the defined target ranges TR can also be sloped or shaped in some arbitrary form. In some possible implementations, where the target region TR defines a specific slope, it can be useful to allow the recorded traces to be shifted in time.

Figure 2:
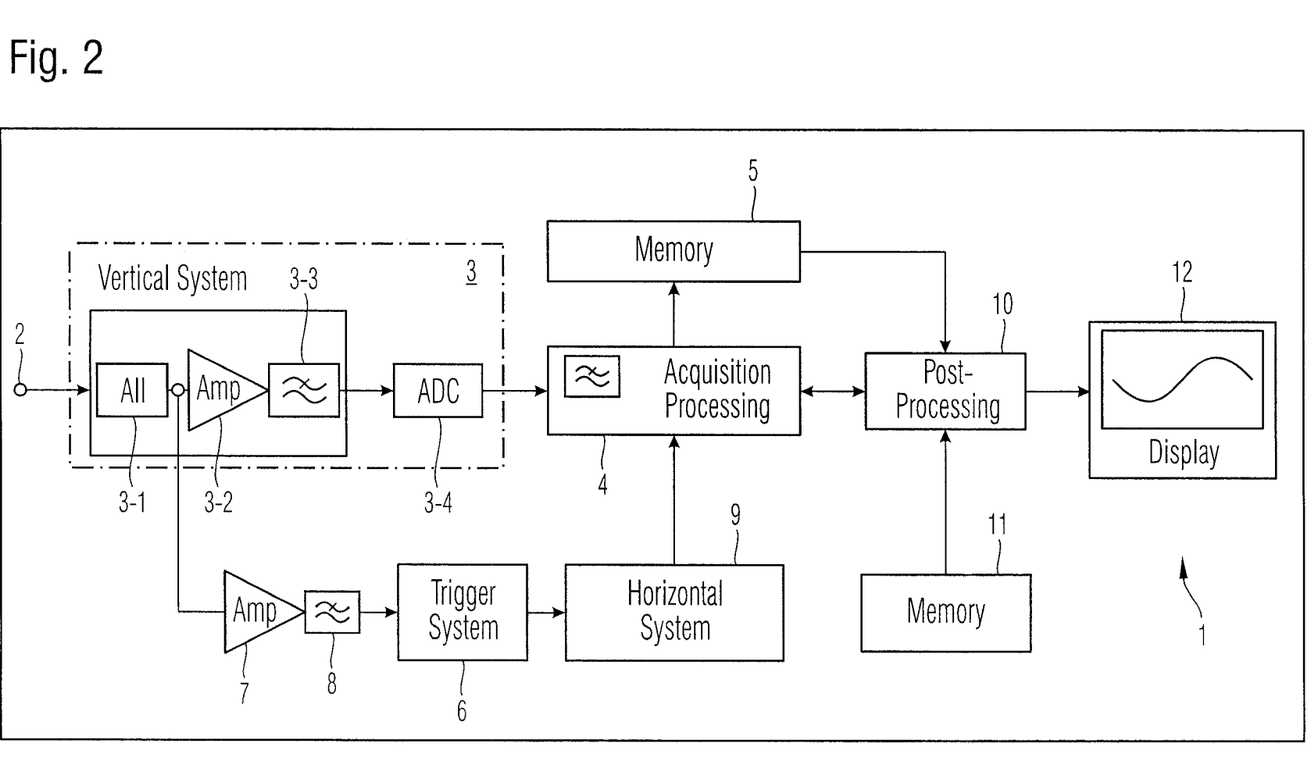
FIG. 2 shows a block diagram of a possible exemplary embodiment of a measurement apparatus according to a further aspect of the present invention.

FIG. 2 shows a block diagram of a possible exemplary embodiment of a measurement apparatus 1 according to a further aspect of the present invention. The measurement apparatus 1 illustrated in the specific embodiment of FIG. 2 is a digital oscilloscope. The measurement apparatus 1 comprises a post-processing unit 10 adapted to compare an acquired measurement signal representing a dynamic physical quantity over time stored in a first memory 5 of the measurement apparatus 1 with a predefined signal characteristic of the same physical quantity or with a predefined signal characteristic of another physical quantity being dependent from the respective physical quantity stored in a second memory 11 of said measurement apparatus to calculate a comparison result that is further adapted to adjust a waveform representing the acquired measurement signal based on the calculated comparison result automatically. The measurement apparatus 1 shown in FIG. 2 does also comprise a configuration interface (not illustrated) used to configure the predefined signal characteristic of the physical quantity stored in the second memory 11 in response to a user input. Further, the measurement apparatus 1 can comprise a configuration interface used to load a selected predefined signal characteristic of the physical quantity from a signal characteristic repository stored in a database connected to the configuration interface via a network. The measurement apparatus 1 comprises a signal input 2 adapted to receive an analog measurement signal of the dynamic physical quantity provided by a probe attached to a measurement object or device under test DUT and comprises an analog to digital converter 3-4 adapted to convert the received analog measurement signal into a digital measurement signal acquired and stored in the first memory 5 of the measurement apparatus 1. As can be seen in the embodiment illustrated in FIG. 2, the measurement apparatus 1 formed by a digital oscilloscope comprises a vertical subsystem 3 allowing to position and scale the waveforms vertically. In the illustrated embodiment, the measurement apparatus 1 comprises a signal input 2 receiving a measurement signal provided by a probe such as a current probe. The measurement apparatus 1 as shown in FIG. 2 is a digital oscilloscope and can comprise four main functional blocks including a vertical system 4, a horizontal system 9, a trigger system 6 and a display system 12. The vertical system 4 addresses the attenuation or amplification of the received signal. The horizontal system 9 comprises a the measurement instrument time base and can control the amount of time per division shown horizontally across the screen of the display unit 12. The triggering system 6 of the digital oscilloscope 1 illustrated in FIG. 2 performs as a basic function the stabilization of the signal and initiates the digital oscilloscope 1 to make an acquisition. The triggering system 6 allows the user to select and modify any actions of specific types of triggers. Finally, the display system or display unit 12 includes the display itself and its drivers as well as any software components required to implement different display functions. The digital oscilloscope 1 illustrated in FIG. 2 comprises the signal input 2 adapted to receive an analog measurement signal provided by a probe attached to the measurement object. The vertical system 3 of the digital oscilloscope 1 can comprise an analog to digital converter ADC 3-4 adapted to convert the received analog signal into a digital measurement signal.

In the illustrated embodiment, the vertical system 3 of the digital oscilloscope 1 comprises an attenuation unit 3-1, an amplifier 3-2 and a low-pass filter 3-3. The output of the low-pass filter 3-3 is connected to the analog input of the analog to digital converter 3-4 of the logical system 1. The analog-to-digital converter 3-4 is adapted to convert the received analog signal into a digital measurement signal. The analog to digital converter 3-4 samples the signal at discrete points in time and provides samples which can be supplied to an acquisition and processing unit 4 of the digital oscilloscope 1 as shown in FIG. 2. The time between sample points is the sample interval and it represents digital values stored in a memory to produce a resulting waveform. The time between waveform points is called waveform interval. Acquisition modes can control how waveform points are produced from sample points. Sample points are the digital values derived directly from the analog to digital converter 3-4. A sample interval refers to the time between these sample points. Waveform points are the digital values that are stored in a memory and can be displayed to construct the waveform. The time value difference between waveform points is referred to as the waveform interval. The sample interval and the waveform interval may or may not be the same. This fact provides for different acquisition modes wherein a waveform point is comprised of several sequentially acquired sample points. Further, waveform points can be created from a composite of sample points taken from multiple acquisitions. There are different types of acquisition modes, in particular a sample mode, a High Res mode, a peak detection mode and an RMS mode. In the sample mode, a waveform point is created with one sample for each waveform interval. In the High Res mode, an average of the samples in the waveform interval is displayed for each interval. In the peak detection mode, the minimum and maximum of the sample points within a waveform are displayed for each interval. In the RMS mode, the RMS value of the samples within the waveform interval can be displayed. This is proportional to the instantaneous power. Further possible modes include an envelope mode or an average mode. In the envelope mode, the minimum and maximum waveform points from multiple acquisitions are combined to form a waveform that shows minimum/maximum accumulation over time. In the average mode, the oscilloscope saves one sample point during each waveform interval as in the sample mode. However, waveform points from consecutive acquisitions are averaged to produce a final displayed waveform. The average mode reduces noise without loss of bandwidth which requires a repeating signal.

The advantage of a digital oscilloscope as illustrated in FIG. 2 resides in its ability to store waveforms for later viewing. To this end, the front panel of the measurement apparatus 1 can comprise buttons which allow to start and stop the acquisition of the signal. It is also possible that the digital oscilloscope does automatically stop acquiring a signal after one acquisition is complete or after one set of records has been turned into an envelope or average waveform. The acquisition of the signal is performed by the acquisition and processing unit 4 shown in the block diagram of FIG. 2. The acquired measurement signal is stored by the acquisition and processing unit 4 in the acquisition memory 5 of the digital oscilloscope 1.

The digital oscilloscope 1 as shown in FIG. 2 can further comprise a trigger system 6 receiving the output signal of the attenuation unit 3-1 of the vertical system 3 via a signal amplifier 7 and a low-pass filter 8. The trigger system 6 allows to capture signal events for detailed analysis and provides a stable view of repeating waveforms. The digital oscilloscope 1 further comprises a horizontal system 9 as shown in the block diagram of FIG. 2. The horizontal system 9 stresses performance metries such as a sample rate and memory depth related to the acquisition and conversion of the measurement signal. The digital oscilloscope 1 shown in the embodiment of FIG. 2 comprises a post-processing unit 10. The post-processing unit 10 comprises a processor adapted to compare the acquired digital measurement signal stored in the acquisition memory 5 with a predefined signal characteristic stored in a further memory 11 of the oscilloscope 1 to calculate a comparison result and is adapted to adjust a waveform representing the acquired digital measurement signal stored in the acquisition memory 5 based upon the calculated comparison result. The adjusted waveform of the measurement signal is then displayed as a signal trace along a time axis on a screen of a display unit 12 of the digital oscilloscope 1.

The signal input 2 of the measurement apparatus 1 illustrated in the block diagram of FIG. 2 can be connected to a probe attached to a device under test DUT. This probe can be for instance a current probe such as a Rogowski coil current probe as illustrated in FIG. 5. Further components can be provided for impedance adaption and for equalizing. The Rogowski coil illustrated in FIG. 5 comprises an electrical probe for measuring alternating currents or high-speed current pulses. The alternating or pulse current in a conductor develops a magnetic field and an interaction of this magnetic field and the Rogowski coil local to the magnetic field gives rise to an induced voltage within the coil of the Rogowski probe which is proportional to a rate of change of the electrical current being measured. The output of the Rogowski coil is connected to an electrical integrator circuit to provide an output signal that is proportional to the measured current. The current probe illustrated in FIG. 5 is not capable to capture a DC portion of the measured signal. Accordingly, a measurement apparatus using a current probe such as illustrated in FIG. 5 can be implemented with a processing method according to the present invention to overcome the limitation of the used probe by exploiting technical knowledge about the device under test DUT measured by the probe, in particular using a predefined signal characteristic stored in the local memory 11 of the measurement apparatus 1. Using the knowledge of the system or device under test DUT, the measurement apparatus 1 can record the signal as if knowing the DC portion after all. The measurement apparatus 1 uses system knowledge to provide a user with more useful information to perform a system analysis of the device under test DUT. The output signal of the post-processing unit 10 can provide a DC offset compensation which makes it possible to compare different measurement signals more reliably with each other. The method according to the present invention can be used for processing a measurement signal of any kind of dynamic physical quantity which can be transformed into an electrical representative signal. The method according to the present invention is not restricted for use in a digital oscilloscope 1 but can be used for any kind of measurement apparatus 1 provided for processing measurement signals received from a signal probe.

The invention claimed is:

1. A method for processing a measurement signal of a dynamic physical quantity comprising the steps of:
    acquiring a measurement signal representing the dynamic physical quantity over time, wherein the acquired measurement signal is stored in a first memory of a measurement apparatus;
    comparing, by a processor of the measurement apparatus, the acquired measurement signal with a predefined signal characteristic of the respective physical quantity or with a signal characteristic of another physical quantity being dependent from the respective physical quantity to provide a comparison result, wherein the signal characteristic of the physical quantity is read from a second memory of the measurement apparatus; and
    adjusting a waveform representing the acquired measurement signal based upon the comparison result, wherein the adjusted waveform of the measurement signal is displayed as a signal trace along a time axis on a screen of a display unit of the measurement apparatus and wherein the waveform representing the measurement signal is adjusted by shifting the associated signal trace on the screen of the display unit perpendicular to the time axis.

2. The method according to claim 1 wherein the predefined signal characteristic of the physical quantity comprises
    a value or value range of the physical quantity at a specific time or during a specific time period,
    a slew rate of the physical quantity, and
    a specific signal form or specific signal pattern of the physical quantity.

3. The method according to claim 1 wherein an analog measurement signal of the dynamic physical quantity is provided by a probe attached to a measurement object.

4. The method according to claim 3 wherein the analog measurement signal provided by the probe is converted by an analog to digital converter into a digital measurement signal acquired and stored in the first memory.

5. The method according to claim 1 wherein the predefined signal characteristic of the physical quantity stored in the second memory is configured by means of a configuration interface.

6. The method according to claim 1 wherein the at least one predefined signal characteristic stored in the second memory is loaded from a signal characteristic repository stored in a database comprising a plurality of specific signal characteristics for a plurality of selectable measurement objects.

7. The method according to claim 3 wherein the measurement object comprises an electronic circuit of a device under test, DUT.

8. The method according to claim 7 wherein the predefined signal characteristic is derived from a circuit design or specification of the device under test, DUT, or derived from a test protocol applied to the device under test, DUT.

9. A measurement apparatus comprising a processor adapted to compare an acquired measurement signal representing a dynamic physical quantity over time stored in a first memory of said measurement apparatus with a predefined signal characteristic of the respective physical quantity or with a predefined signal characteristic of another physical quantity being dependent from the respective physical quantity stored in a second memory of said measurement apparatus to calculate a comparison result and further adapted to adjust a waveform representing the acquired measurement signal based upon the calculated comparison result, wherein the adjusted waveform of the measurement signal is displayed as a signal trace along a time axis on a screen of a display unit of the measurement apparatus and wherein the waveform representing the measurement signal is adjusted by shifting the associated signal trace on the screen of the display unit perpendicular to the time axis.

10. The measurement apparatus according to claim 9 further comprising a configuration interface used to configure the predefined signal characteristic of the physical quantity stored in the second memory of said measurement apparatus in response to a user input and/or used to load a selected predefined signal characteristic of the physical quantity from a signal characteristic repository stored in a database.

11. The measurement apparatus according to claim 9 further comprising a signal input adapted to receive an analog measurement signal of the dynamic physical quantity provided by a probe attached to a measurement object and comprising an analog to digital converter adapted to convert the received analog measurement signal into a digital measurement signal acquired and stored in the first memory of the measurement apparatus.

12. A digital oscilloscope comprising
    a signal input adapted to receive an analog measurement signal provided by a probe attached to a measurement object;

an analog to digital converter adapted to convert the received analog signal into a digital measurement signal;
a first memory adapted to acquire and store the converted digital measurement signal;
a second memory which stores at least one predefined signal characteristic of a physical quantity or at least one physical characteristic of another physical quantity being dependent from the respective physical quantity;
a processor adapted to compare the acquired digital measurement signal stored in the first memory with the predefined signal characteristic stored in the second memory to calculate a comparison result and to adjust a waveform representing the acquired digital measurement signal stored in the first memory based upon the calculated comparison result,
wherein the adjusted waveform of the measurement signal is displayed as a signal trace along a time axis on a screen of a display unit of said digital oscilloscope, wherein the waveform representing the measurement signal is adjusted by shifting the associated signal trace on the screen of the display unit perpendicular to the time axis.

* * * * *